United States Patent
Tomita et al.

[11] Patent Number: 5,874,365
[45] Date of Patent: Feb. 23, 1999

[54] SEMICONDUCTOR WAFER ETCHING METHOD

[75] Inventors: Masahiro Tomita, Anjyo; Yasuo Souki, Toyota; Motoki Ito, Nagoya; Kazuo Tanaka, Obu; Hiroshi Tanaka, Toyokawa, all of Japan

[73] Assignee: Nippondenso Co., Ltd., Kariya, Japan

[21] Appl. No.: 328,528

[22] Filed: Oct. 25, 1994

[30] Foreign Application Priority Data

Nov. 4, 1993 [JP] Japan ................................ 5-275223

[51] Int. Cl.⁶ .................................................. H01L 21/302
[52] U.S. Cl. .......................... 438/747; 438/752; 216/46; 216/90
[58] Field of Search .................. 216/46, 45, 42, 216/90; 156/637.1; 438/747, 752, 753; 134/13

[56] References Cited

U.S. PATENT DOCUMENTS

| | | | |
|---|---|---|---|
| 3,847,690 | 11/1974 | Campbell, Jr. et al. | 156/13 |
| 4,384,919 | 5/1983 | Casey | 156/645 |
| 5,300,172 | 4/1994 | Ishiwata et al. | 156/662 |
| 5,324,410 | 6/1994 | Kummer et al. | 204/279 |

FOREIGN PATENT DOCUMENTS

| | | |
|---|---|---|
| 59-069933 | 4/1984 | Japan . |
| 63-040325 | 2/1988 | Japan . |
| 1145816 | 6/1989 | Japan . |
| 3025235 | 3/1991 | Japan . |
| 3041935 | 4/1991 | Japan . |
| 3056132 | 5/1991 | Japan . |
| 03212811 | 9/1991 | Japan . |
| 4291921 | 10/1992 | Japan . |
| 5033527 | 4/1993 | Japan . |

*Primary Examiner*—Bruce Breneman
*Assistant Examiner*—George Goudreau
*Attorney, Agent, or Firm*—Pillsbury Madison & Sutro LLP

[57] ABSTRACT

A semiconductor wafer etching method is disclosed that allows etching without use of restricted ozone-destroying solvents such as trichloroethane or fluorocarbons. This method involves forming a protective film of silicon resin or alkali resistant resin on a semiconductor wafer. Then, a surface region of the wafer not covered by the protective film is etched. Finally, the protective film is peeled from the semiconductor wafer without damaging the wafer or employing solvents harmful to the environment.

22 Claims, 3 Drawing Sheets

SEMICONDUCTOR WAFER ETCHING METHOD

CROSS REFERENCE TO RELATED APPLICATIONS

This application is based on and claims priority from Japanese Patent Application 5-275223 filed Nov. 4, 1993, the contents of which are hereby incorporated herein by reference.

BACKGROUND OF THE INVENTION

1. Field of the Invention

This invention relates to a method of etching semiconductor wafers.

2. Description of the Related Art

A conventional method for etching semiconductor wafers, which is illustrated in FIG. 6, involves coating protective resist 35 on pattern surface 39 of semiconductor wafer 34. Protective film 37 is coated on sections other than those requiring etching on etching surface 38, and alumina plate 36 is adhered on pattern surface 39 via protective film 37. Then etching is performed and a thin section (not shown in the Figure) is formed on a diaphragm, etc., of the etching surface 38.

In the conventional etching method, each manufacturing step represented by process (a) to (f) in FIG. 7 is performed. First, in protective resist application step (a), protective resist 35 is coated on pattern surface 39 in order to prevent pattern surface 39 of semiconductor wafer 34 from being scratched.

Next, in alumina plate application step (b), alumina plate 36 is heated with a hot plate, etc., and solid petroleum protection wax is heated and melted, and spread over the alumina plate 36. Then, pattern surface 39 side is directed toward the alumina plate 36 side, and set so that semiconductor wafer 34 is pressed thereon. The melted petroleum protection wax is then applied in the same manner to the circumference of semiconductor wafer 34.

Etching surface 38 is alkali-etched in etching step (c). When the alkali etching is completed, the semiconductor wafer is reheated with a hot plate, or other type of heating device, in alumina plate removal step (d) in order to remove unnecessary alumina plate 36.

In wax cleaning step (e), the petroleum protection wax adhered to the semiconductor wafer 34 is cleaned off with trichloroethane. Finally at resist peeling step (f), the protective resist 35 is peeled and cleaned off with a solvent such as FUJI HUNT MS1001 and trichloroethane.

With the above-described conventional semiconductor wafer etching method, as the protective film 37 is formed by heating and melting the petroleum protection wax, which is solid at room temperature, the steps of applying an alumina plate (b) and removing the alumina plate (d) are performed. When the semiconductor wafer 34 is pressed against the alumina plate 36 as the alumina plate 36 is applied thereto in step (b), the roughness of the surface of alumina plate 36 affects pattern surface 39 of the semiconductor wafer 34, which could result in pattern surface 39 being scratched. Therefore, protective resist 35 must be used in order to prevent scratches. Protective film 37 and protective resist 35 are peeled off and cleaned after etching, but the trichloroethane used as the peeling solvent for both items must have an outstanding cleaning efficiency. Due to the fact that increased attention is being paid to global environmental pollution, and especially as the destruction of the ozone layer is becoming a worldwide problem, the use of trichloroethane has been limited with fluorocarbons as an ozone-destruction organic substance (chlorine solvent), and thus, future use will not be possible.

Therefore, with conventional technology, complete peeling and cleaning of the protective resist 35 and protective film 37 will not be possible.

SUMMARY OF THE INVENTION

This invention aims at accurately etching a semiconductor wafer using a protective film that can be sufficiently peeled and cleaned from the wafer without using restricted solvents such as trichloroethane or fluorocarbons.

To achieve this object, this invention features a protective film formation process that designates the semiconductor wafer's side, first surface, and first portion of a second surface opposite the first surface as non-etched surfaces, and applies and forms an alkali resistant resin or silicon resin protective film on the entire non-etched surface. The etching process then etches a second portion of the second surface after formation of the protective film, and the protective film is peeled from the wafer and the wafer is cleaned. The protective film is peeled using a solvent.

An addition reaction type, deoxime type or deacetone type silicon resin may be used as the protective film coated and formed in the protective film formation process.

According to the present invention, an alkali resistant resin or silicon resin protective film is formed on the sections of the semiconductor wafer that are not etched, and then the designated etching surface is etched. Thus, only the etching surface is etched. After etching, the protective film is completely separated and cleaned with a solvent other than trichloroethane or fluorocarbons.

BRIEF DESCRIPTION OF THE DRAWINGS

Other features, characteristics, and advantages of the present invention as well as the function of related elements of structure will become apparent from a study of the specification following detailed description, the appended claims, and the drawings, all of which form a part of this application. In the drawings:

DETAILED DESCRIPTION OF THE PRESENTLY PREFERRED EXEMPLARY EMBODIMENTS

The first embodiment of the present invention will be described with reference to FIG. 1.

Figure 1:
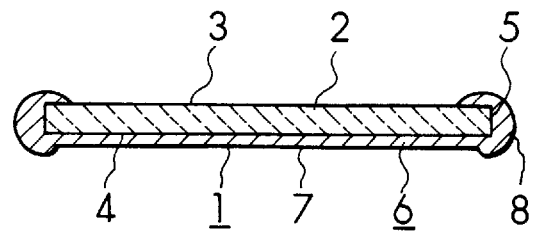
FIG. 1 is a cross-sectional view showing components of a semiconductor wafer with a protective film according to the present invention.

FIG. 1 shows a semiconductor wafer body 1 comprising semiconductor wafer 2 and a protective film 6. The protective film 6 is placed on the opposite side of the wafer 2 relative to the wafer surface (hereinafter etching surface) 3, which in the etching method is etched for forming a thin section (not shown in the Figure) for the Si diaphragm, etc. The non-etched circumference of the semiconductor wafer body 1 is represented by numeral 5, while numeral 7 represents the rear protective film formed over pattern surface 4, while numeral 8 is the circumference of a protective film covering side circumference 5 and rim excluding the etching section thereby forming protective film 6.

In this embodiment, semiconductor wafer 2 from which protective film 6 is peeled and cleaned after passing through the alkali etching process in the above state is obtained (not shown in the Figure).

Figure 2:
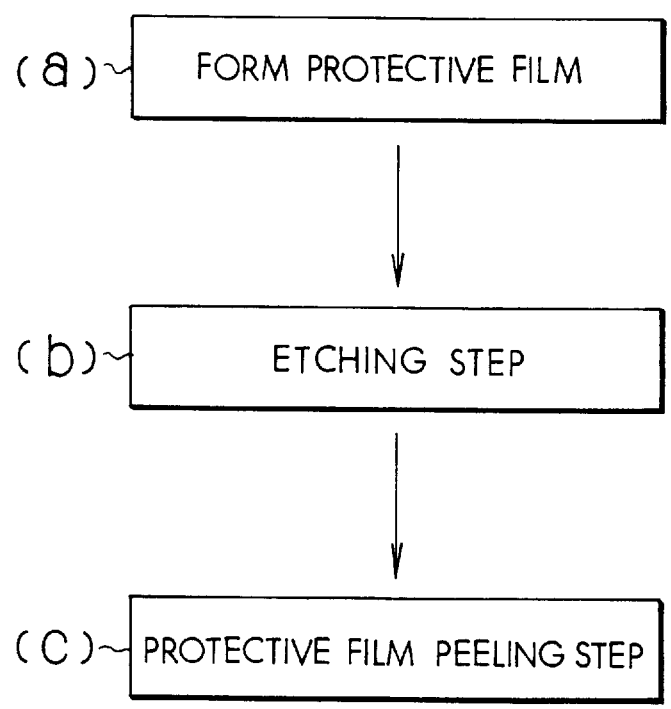
FIG. 2 illustrate steps in the etching process to manufacture the device of FIG. 1.

This type of etching method is explained below in accordance with the steps shown in FIG. 2, where step (a) represent the formation of the protective film, step (b) represent the etching of the semiconductor wafer 2, and step (c) represents the peeling of the protective film 6.

First, protective film 6 is formed in step (a). Here, to select an effective material for protective film 6, a material with outstanding heat resistant and alkali resistant properties is selected. To evaluate the amount of etching fluid that enters between the protective film 6 and semiconductor wafer 2 during the etching in the next step, various tests were extensively performed. It was confirmed through the tests that alkali resistant resin, such as terpene and polystyrene, etc., and addition reaction type, de-alcohol, deoxime and deacetone type silicon resins, could be used effectively. Of these materials, the alkali resistant resins such as terpene and polystyrene and the de-alcohol type silicon resin demonstrated an inferior sealing characteristic with semiconductor wafer 2. On the other hand, the amount of etching fluid which entered through the addition reaction type, deoxime or deacetone type was limited to approximately several mm from the end of semiconductor wafer 2. Thus, it was confirmed that the incorporation of these types of silicon resin were the most effective.

Based on these results, in this embodiment deoxime type silicon resin was selected from the dakotan and deoxime types found to have a sufficient peeling effect in eliminating the protective film 6 actually formed in the post step. Protective film 6 was formed by coating this on rear protective film 7 and circumference protective film 8. The method for coating rear protective film 7 can be any standard method, but in this case, a spin coating method was used, and the silicon resin was coated under the conditions of 800 rpm, for 8 seconds. In the same manner, any standard method can be used to coat circumference protective film 8, but in this case, a roller coating method was used under the conditions of 10 rpm, for 29 seconds. Rear protective film 7 and circumference protective film 8 were coated in this manner to form the protective film 6 having a film thickness of in the range of from about 20 $\mu$m to about 25 $\mu$m. The formed protective film 6 was heated and dried at 80° C. for thirty minutes, thus fixing the film onto semiconductor wafer 2 and securely protecting the non-etched surface.

The thickness of protective film 6 formed here was set in the range of from about 20 $\mu$m to about 25 $\mu$m. If the thickness is reduced to less than 15 $\mu$m, pin holes may form, and in the following etching process, the etching fluid may infiltrate through the pin holes, thus causing damage to the non-etched surface of semiconductor wafer 2 (not shown in the Figure). Thus, the film thickness must be at least 15 $\mu$m or more. On the other hand, if the film thickness exceeds about 25 $\mu$m, protective film 6 itself may peel, and the etching fluid may enter past the peeled surface thereby damaging the non-etched surface. Thus, the favorable thickness of the protective film 6 composed of silicon resin should be in the range of from about 15 $\mu$m to about 25 $\mu$m. This does not apply when a material other than an alkali resistant material, etc., is used as protective film 6, and the effective range can easily be specified by constantly measuring the film thickness according to the material being used.

Etching is done in the second etching step (b), and the conventional etching may be performed. For example, in this case, the etching was done with a 33% KOH water-soluble solution at 80° C. and submerged for seventy minutes to form a Si diaphragm.

Finally in the protective film peeling step (c), protective film 6 is no longer required after the etching is completed. Thus, protective film 6 is peeled and cleaned with a designated solvent. The solvent used here must securely peel off the protective film 6, and must not contain trichloroethane or fluorocarbons restricted in use. In consideration of the conformity with the deacetone or deoxime type silicon resin, a compound solution of alkyl-benzene sulfonic acid and xylene (e.g., KSR-1 produced by KANTO KAGAKU, Japan) which can sufficiently peel the film was selected. The selected solvent is often determined by the material used as protective film 6. For example, if the above mentioned alkali resistant resin is used, aromatic compounds are effective as a solvent. Of course, there is no need to restrict the solvent used. In this embodiment, all normally conceivable solvents, other than KANTO KAGAKU KSR-1, could be used for peeling and cleaning deacetone or deoxime type silicon resin protective film 6 as long as protective film 6 could be peeled and cleaned, and the solvent usage was not restricted. The etching process of semiconductor wafer 2 was completed by peeling and separating protective film 6 with the selected KANTO KAGAKU KSR-1.

With the semiconductor wafer etching method composed of the above-described steps, protective film 6 was formed with the spin coating method for rear protective film 7 and the roller coating method for circumference protective film 8 during the protective film formation process. Therefore, the protective film coating procedure can be easily automated. With the conventional protective film formation process, a material always solid at room temperature was used for the protective film, and at least the alumina plate application step and alumina plate removal process were required. Automation of both processes was difficult, and thus, they were relegated to manual labor. The man-hours required for the automatic coating in this embodiment were approximately 1/10 of the man-hours required for manual coating in the conventional method. Thus, the protective film coating method according to the present invention is extremely effective in these days where automation is desired due to technological advancement.

Furthermore, by using the etching method according to the present invention, equivalents of the conventional protective resist coating step, alumina plate application step, alumina plate removal step, and the protective resist peeling step are eliminated, thereby simplifying the process and reducing the total number of man-hours required for etching the semiconductor wafer.

The protective film coating method used in the instant embodiment does not necessarily need to be automated, and may also be performed manually.

As the thickness of the silicon resin protective film 6 is relatively thick at 15 μm to 25 μm, the semiconductor wafer pattern can be securely protected even without using protective resist. Since the conventionally used alumina plate is not used, there is no worry that the pattern surface of the wafer will be damaged by the roughness of the alumina plate, Since an alkali resistant resin or a silicon resin is used as the protective film, the film can be sufficiently peeled and cleaned with a non-restricted solvent, as opposed to the conventional method in which a restricted trichloroethane solvent, etc. is used. The peeling of the protective film in this embodiment using deoxime silicon resin was especially favorable by using KANTO KAGAKU KSR-1 as the solvent. Thus use of trichloroethane and fluorocarbons can be completely eliminated from the semiconductor wafer etching process.

Even if the silicon etching residue is reduced to be thin at, for example 5 μm to 10 μm, on the semiconductor wafer, the protective film thickness is sufficient, and acts as a reinforcement, thereby preventing semiconductor wafer cracks.

The second embodiment of the present invention will now be described. In the semiconductor wafer with protective film etched as in the first embodiment, the sealing of the silicon resin protective film and semiconductor wafer was sufficient as seen with the amount of etching fluid that infiltrated the film in the test. However, if an alkali resistant resin such as terpene or polystyrene, etc., or de-alcohol silicon resin was used, the sealing properties dropped somewhat, thus creating the risk that a large amount of etching fluid may enter. Thus it is necessary to securely avoid the risk that the etching fluid may enter when using those materials having an inferior sealing property.

The present inventors performed assorted inspections and evaluations on the etching fluid infiltration from the clearances between the protective film and semiconductor wafer. As a result, a method to increase the sealing force between the protective film and semiconductor wafer to prevent infiltration of etching fluid was realized. This method is explained below following the second embodiment shown in the drawings.

Note that all etching in the second embodiment was performed manually.

Figure 3:
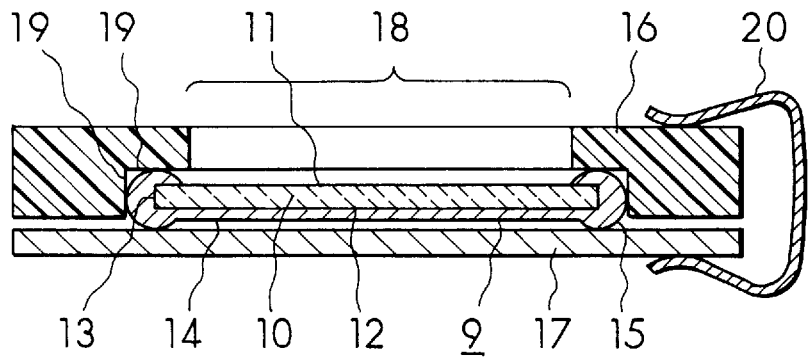
FIG. 3 is a cross-sectional view showing a pressing process for a semiconductor wafer with a protective film according to the present invention.

FIG. 3 shows the pressing process that increases the sealing force between the protective film and the semiconductor wafer. After this step, the wafer is etched while the protective film and semiconductor wafer are maintained with a large sealing force therebetween. Semiconductor wafer body 9 shown in FIG. 3 includes semiconductor wafer 10, etching surface 11, pattern surface 12, circumference section 13, that is, the side surface, rear protective film 14, and circumference protective film 15. This semiconductor wafer body is the same as the semiconductor wafer body 1 with protective film 6 used in the first embodiment, and is manufactured with a process according to FIG. 2.

The manufactured semiconductor wafer with protective film 14 has a holder 16, presser bar also referred to herein as a plate member 17, and pressing means 20 as shown in FIG. 3. This pressing process was performed in accordance with the following method.

Resin holder 16 is attached to cover the semiconductor wafer 10 with protective film 14 from the etching surface 11 side so that holder 16 contacts circumference protective film 15. Holder 16 is large enough to completely cover semiconductor wafer 10 with protective film 14, and is approximately square in shape, though other shapes are equally possible. Holder window 18 with a size approximately the same as that of etching surface 11 is created in the center of holder 16 so that etching surface 11 could be etched without problem in the following step. Groove 19 was created along holder window 18 so that semiconductor wafer 10 could be held without movement. Holder window 18 is aligned with etching surface 11 so that groove 19 fits circumference protective film 15. Holder 16 is placed over semiconductor wafer body 9.

Next, square stainless steel presser bar 17 having the approximately the same dimensions as those of holder 16 was set on protective film 14 so that it matches up to holder 16 along their peripheral edges. A clamp composed of pressing means 20 with differing sides (square) was set so that preset holder 16 and presser bar 17 were held simultaneously. Finally, the semiconductor wafer 10 was etched in this state to obtain an etched semiconductor wafer (not shown).

With the above-described type of semiconductor wafer etching method, the holder 16 and presser bar 17 holding force was additionally strengthened with the mechanical pressure exerted by the clamp, thereby pressing the protective film 14 and increasing the sealing force between the protective film 14 and the semiconductor wafer body 10. Thus, the risk of the etching fluid infiltrating from the clearances between the protective film 14 and the semiconductor wafer 10 is avoided. When this etching method was applied, the silicon resin with a relatively good sealing property became a stronger protective film, and even if an alkali resistant resin with inferior sealing properties were used, a secure sealing force could be obtained. This thereby increases the range of materials that can be used without difficulty as the protective film. For example, besides alkali resistant resin such as terpene and polystyrene and de-alcohol silicon resin, any material that can be peeled with a non-restricted solvent and which is heat resistant and chemically resistant to the etching materials can be selected.

Furthermore, almost no etching fluid infiltrates because of the direct mechanical pressure applied on the circumference protective film, and therefore, the width of the protective film coated on the non-etched rim can be reduced and a larger etching section can be secured.

It is not necessary to strictly observe the shapes shown in FIG. 3 for the holder, presser bar and pressing means used in the pressing process of this embodiment. Other shapes can be used if the same effect is achieved when the sealing force between the protective film and semiconductor wafer increases.

As the holder is made of resin, it is assumed that in some cases, it will deform due to the mechanical pressure of the pressing means. Once the holder deforms, the balance of the pressure is lost, and etching fluid may infiltrate parts of the semiconductor wafer when the mechanical pressure is applied. Various deformations were applied in this embodiment. Other methods that can be applied to even-out the pressure are explained below.

Figure 4:
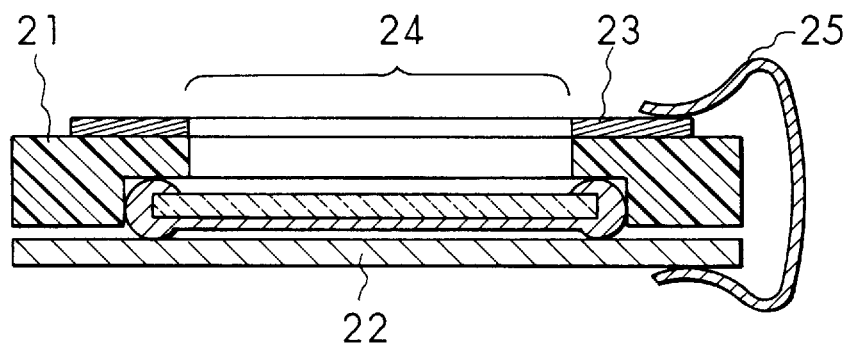
FIG. 4 is a cross-sectional view showing use of a rigid body along with means to apply pressure to the semiconductor device according to the present invention.

FIG. 4 shows a method of evening-out the pressure using a rigid body 23. This method uses rigid window 24 having approximately the same size and shape as the window of holder 21, placing metal or ceramic rigid body 23 smaller than holder 21 onto holder 21, and holding the outer square by the pressing means 25 such as a clamp with the rigid body 23 and presser bar 22 sandwiched inside. This allows the pressure balance to constantly be secured.

The pressure can also be distrubuted by increasing the number of pressing means used.

In some cases, the semiconductor wafer may be damaged due to the peelability of the presser bar and protective film when using various materials or when the pressure is increased for the above reasons. Measures are taken in this embodiment in accordance with the device of FIG. 5 to prevent such peeling from occurring.

Figure 5:
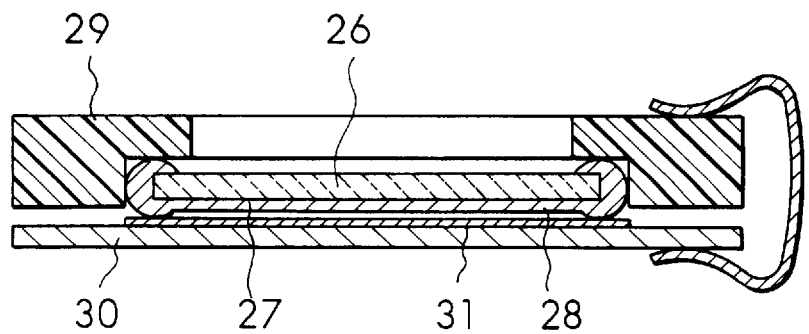
FIG. 5 is a cross-sectional view of use of a separation means in accordance with the present invention.
Figure 6:
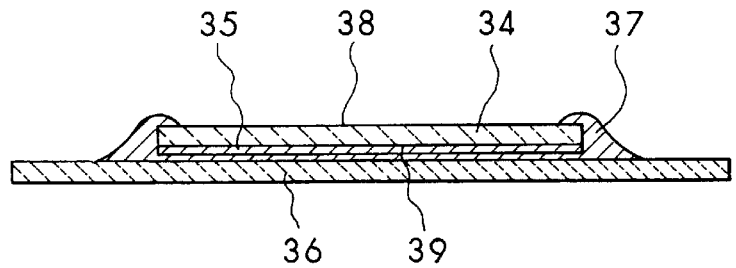
FIG. 6 is a cross-sectional view of a conventional semiconductor wafer.
Figure 7:
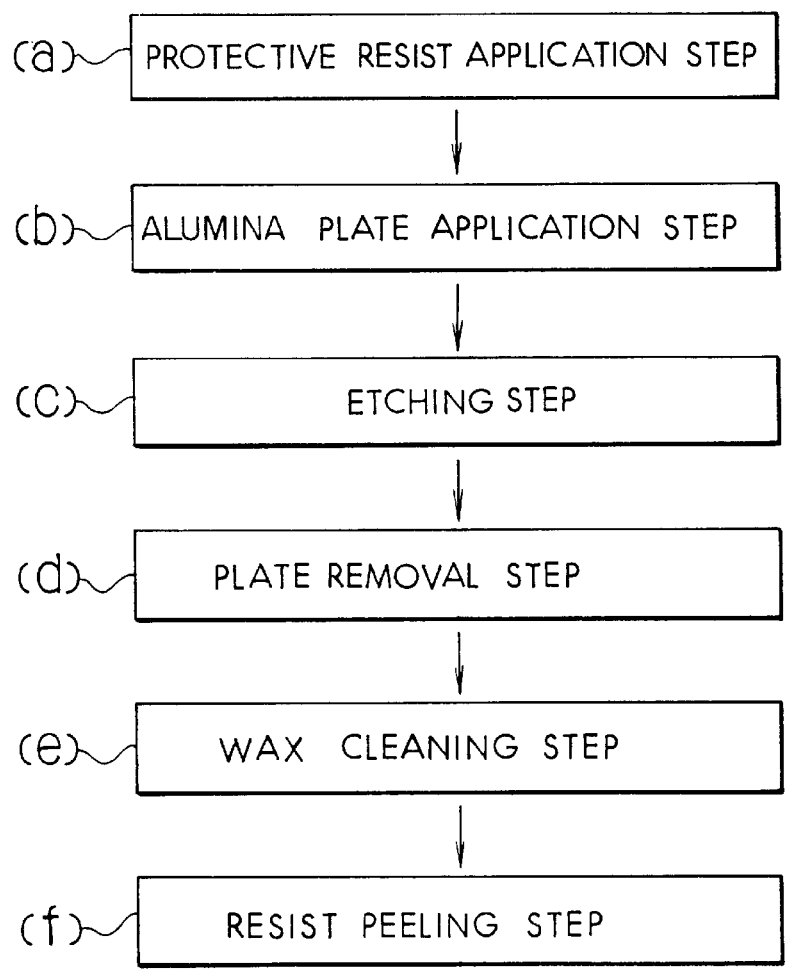
FIG. 7 illustrates steps in the conventional semiconductor etching process.

FIG. 5 shows the device used when the peelability of the protective film and presser bar is poor. The peelability was improved by incorporating a process that uses separation means 31 disposed between protective film 28 and presser bar 30 during the pressing process shown in FIG. 3. Separation means 31 is preferably made of a Teflon sheet with an outer shape larger than the outer peripheral shape of semiconductor wafer 26. Presser bar 30 is disposed next to protective film 28 with separation means 31 therebetween. Presser bar 30 can be removed without force after the designated etching, and damage to semiconductor wafer 26 is minimized. As almost none of protective film 28 is peeled off as presser bar 30 is removed, removing protective film 28 is a simple process, requiring simply exposing protective film 28 to a solvent.

Furthermore, to further even out the pressure when holder 29 and presser bar 30 are held simultaneously, an elastic body such as a sponge can be used for separation means 31.

To improve the sealing properties of the protective film, the thickness of the circumference protective film on the circumference and sides of the semiconductor wafer should be favorable, with the thickness of all circumference protective films being thicker than the thickness of rear protective film 27.

This invention has been described in connection with what are presently considered to be the most practical and preferred embodiments. However, the invention is not meant to be limited to the disclosed embodiments, but rather is intended to cover all modifications and equivalent arrangements included within the spirit and scope of the appended claims.

What is claimed is:

1. A semiconductor wafer etching method comprising the steps of:
    forming a protective film by coating a protective film material comprising a member selected from the group consisting of an alkali resistant resin and a silicon resin on a non-etched region of a semiconductor wafer to entirely cover said non-etched region;
    etching a region of said wafer other than said non-etched region with an etching solution to form an etched region; and
    chemically removing said protective film from said wafer with a solvent other than trichloroethane and fluorocarbons.

2. The semiconductor wafer etching method of claim 1, wherein said protective film is said silicon resin, and said silicon resin is an addition reaction type, deoxime type, or deacetone type silicon resin.

3. The semiconductor wafer etching method of claim 2, wherein said protective film has a thickness in a range of from 15 $\mu$m to 25 $\mu$m.

4. The semiconductor wafer etching method of claim 1, wherein said non-etched region of said semiconductor wafer includes a first surface, a first portion of a second surface opposite to said first surface, and a side surface of said semiconductor wafer, and wherein said etched region of said semiconductor wafer is a second portion of said second surface different from said first portion.

5. The semiconductor wafer etching method of claim 4, wherein:
    said first portion of said second surface of said non-etched region includes a peripheral edge portion of said second surface; and
    said protective film is formed on said non-etched region such that a thickness of said protective film at said peripheral edge portion of said second surface and a peripheral edge portion of said first surface is greater than at a central portion of said first surface.

6. The semiconductor wafer etching method of claim 1, wherein said protective film material is said silicon resin and said solvent is a combination of alkyl-benzene sulfonic acid and xylene.

7. The semiconductor wafer etching method of claim 1, wherein said protective film material is said alkali resistant resin and said solvent is an aromatic compound.

8. A method for etching semiconductor wafers, comprising the steps of:
    forming a protective resin coating on surfaces of a semiconductor wafer not to be etched to cover a first surface, a peripheral surface, and edges of a second surface opposite to said first surface, said protective resin coating including a member selected from the group consisting of an alkali resistant resin and a silicon resin;
    etching said second surface not covered with said protective resin coating with an etching solution; and
    chemically removing said protective resin coating from said semiconductor wafer with a solvent other than trichloroethane and fluorocarbons.

9. The semiconductor wafer etching method of claim 4, further comprising steps of:
    setting a holder on said second surface of said semiconductor wafer, said holder having a recess for holding said semiconductor wafer thereon and an opening on a bottom of said recess sized the same as said etched region of said semiconductor wafer for exposing said etched region, said setting step being conducted after said forming step and before said etching step; and
    setting a plate member on said first surface of said semiconductor wafer with said protective film interposed therebetween to sandwich said semiconductor wafer between said plate member and said holder under pressure.

10. The semiconductor wafer etching method of claim 9, further comprising a step of:
    setting a rigid body on said holder, said rigid body having an opening with the same size and shape as said opening of said holder to expose said etched region from said opening of said rigid body.

11. The semiconductor wafer etching method of claim 10, wherein said rigid body is made of metal or ceramics.

12. The semiconductor wafer etching method of claim 9, further including a step of:
    disposing a separation member on said protective film on said first surface of said semiconductor wafer before said step of setting said plate member,
    wherein said plate member is disposed on said first surface of said semiconductor wafer with said protective film and said separation member interposed therebetween.

13. The semiconductor wafer etching method of claim 12, wherein said separation member is a TEFLON sheet or an elastic sheet.

14. The semiconductor wafer etching method of claim 9, wherein said alkali resistant resin is selected from the group consisting of terpene and polystyrene, and wherein said silicon resin is selected from the group consisting of addition reaction type, de-alcohol, deoxime and deacetone type silicon resins.

15. The semiconductor wafer etching method of claim 4, wherein a thickness of a portion of said protective film formed on said side surface and a peripheral edge portion of said first surface of said semiconductor wafer is thicker than a portion of said protective film formed on a central portion of said first surface.

16. The semiconductor wafer etching method of claim 4, wherein said forming step includes spin coating said protective film on said first surface of said wafer and roller coating said protective film on said first portion of said second surface and said side surface.

17. The method of claim 8 further comprising the steps of:

sandwiching said semiconductor wafer and said protective resin coating between a holder and a plate member, said holding having an opening for etching and said plate member having no opening and positioned on said first surface; and clamping said holder and said plate member at outside of said semiconductor wafer to enhance a sealing force between said protective resin coating and said semiconductor wafer.

18. The method of claim 8, wherein said solvent is an aromatic compound.

19. The method of claim 8, wherein said solvent is a compound solution of alkyl-benzene sulfonic acid and xylene.

20. The method of claim 8, wherein said protective resin coating has a thickness in a range of from 15 µm to 25 µm.

21. The method of claim 17 further comprising inserting a separation plate between said plate member and said protective resin coating.

22. The method of claim 17 further comprising disposing a rigid body having an opening for etching on said holder, wherein said holder and said plate member are clamped through said rigid body.

* * * * *